(12) United States Patent  (10) Patent No.: US 6,664,489 B2
Kleinhans et al.  (45) Date of Patent: Dec. 16, 2003

(54) TOUCH SWITCH WITH ILLUMINATED SENSOR ELEMENT SURFACE AND LIGHT GUIDES

(75) Inventors: Andreas Kleinhans, Bretten (DE); Wilfried Schilling, Kraichtal (DE)

(73) Assignee: E.G.O. Elektro-Geraetebau GmbH (DE)

( * ) Notice: Subject to any disclaimer, the term of this patent is extended or adjusted under 35 U.S.C. 154(b) by 0 days.

(21) Appl. No.: 10/136,500

(22) Filed: May 1, 2002

(65) Prior Publication Data

US 2002/0167704 A1 Nov. 14, 2002

(30) Foreign Application Priority Data

May 9, 2001 (DE) .......................... 101 23 633

(51) Int. Cl.[7] .......................... H01H 9/00; H03K 17/94; G09G 5/00
(52) U.S. Cl. .......................... 200/313; 200/600; 341/33; 345/173; 345/176
(58) Field of Search .......................... 200/5 A, 512–519, 200/308–317, 600; 341/33; 345/173, 176; 307/112–116

(56) References Cited

U.S. PATENT DOCUMENTS

| 4,163,883 | A | * | 8/1979 | Boulanger | .................. 200/314 |
|---|---|---|---|---|---|
| 4,288,672 | A | * | 9/1981 | Puccini | ...................... 200/314 |
| 4,855,550 | A | * | 8/1989 | Schultz, Jr. | .................. 200/600 |
| 5,239,152 | A | * | 8/1993 | Caldwell et al. | ............ 200/600 |
| 5,491,314 | A | * | 2/1996 | Dorsey | ...................... 200/313 |
| 5,847,336 | A | * | 12/1998 | Thornton | ................ 200/314 X |
| 5,917,165 | A |   | 6/1999 | Platt et al. | |
| 6,016,134 | A | * | 1/2000 | Ota | ........................ 345/173 X |
| 6,137,072 | A | * | 10/2000 | Martter et al. | .............. 200/512 |
| 6,403,904 | B1 |  | 6/2002 | Schilling | |

FOREIGN PATENT DOCUMENTS

| DE | 69306228 T2 | 5/1994 |
|---|---|---|
| DE | 19714195 A1 | 10/1998 |
| DE | 198 17 195 C1 | 9/1999 |
| DE | 19828978 A1 | 12/1999 |
| DE | 19744791 C2 | 1/2000 |
| JP | 04082416 A | 3/1992 |

* cited by examiner

Primary Examiner—J. R. Scott
(74) Attorney, Agent, or Firm—Akerman Senterfitt

(57) ABSTRACT

A sensor element and a touch switch arrangement have a sensor surface, which engages on the underside of a control surface. The sensor surface is at least partly light-transmitting and is illuminated from below by a LED as the light source. A Funnel-shaped, closed light guide structure is provided, which guides or conducts the light from the LED to the sensor surface or shield against the environment. The light guide structure can additionally have further function (s) such as securing in position or electrical contacting of the sensor surface.

33 Claims, 1 Drawing Sheet

TOUCH SWITCH WITH ILLUMINATED SENSOR ELEMENT SURFACE AND LIGHT GUIDES

FIELD OF APPLICATION

The invention relates to a sensor element having a sensor surface forming part of a capacitive touch switch, the sensor surface being applied to the underside of a control surface. A preferred application is a touch switch for domestic appliances, such as e.g. cooking surfaces.

Sensor elements with a sensor surface forming part of a capacitive touch switch, in which the sensor surface is applied to the underside of a control surface, are known from the prior art. For optical function display purposes in the case of such a sensor surface or touch switch, in some cases in addition to the sensor surface LEDs or similar lighting means are fitted below the control surface. The problem then often exists that said lighting means light up a larger area than is desired.

PROBLEM AND SOLUTION

The problem of the invention is to provide a sensor element of the aforementioned type, where an illuminated identification of a sensor surface is possible, whilst there is no undesired radiation of the lighting.

This problem is solved by a sensor element having a sensor surface, the sensor surface being a part of a capacitive touch switch. The sensor surface is fitted to the underside of a control surface of the capacitive touch switch. The sensor surface is at least partly light-transmitting and is illuminated from below by a light source. A light guide structure for a flux of light from the light source to the sensor surface is provided. The light guide structure shields the light source from the environment and from a remaining underside of the control surface. Advantageous developments of the invention are explained In greater detail hereinafter. By express reference the wording of the claims is made into part of the content of the description.

As a result of the light transmission of the sensor surface according to the invention and which can be in the form of transparency or translucency, in a simple manner a luminous marking can be produced in the vicinity of the sensor surface. Said luminous marking is produced by the light source fitted below the sensor surface. The light conducting or guide means ensure a reliable and essentially precise illumination of the desired point, namely the sensor surface or within the sensor surface. In this way the scattering of light outside the intended area is avoided, because it is prevented by the light guide means.

Advantageously there is one light source or one light guide means per sensor element. This permits an individual, optical identification of each sensor element. In the case of an arrangement with several sensor elements, this should be provided for each sensor element associated with an individual function. Generally used sensor elements can be provided with a common lighting means.

The light guide means are able to shield the light source touch switch against the environment, for example, against the entire environment below the control surface. In the case of a touch switch for a hotplate, the control surface can be the cooking surface, which can be made from glass ceramic material. Advantageously the light guide means shield the light source against other touch switches and/or the remaining underside of the control surface, which can In particular be light transmitting. Therefore a shielding action is particularly important with a light-transmitting control surface.

The light guide means can have a wall, which surrounds the at least one light source and forms a channel to the sensor surface. In this way, advantageously a closed channel can be formed between the light source and the sensor surface and is essentially closed in light-proof manner. The light guide means can at least partly be constructed themselves as a channel wall or merely comprise a channel or its wall. It is possible that they press the intrinsically loose sensor surface against the underside of the control surface and said pressing can take place elastically. Such a sensor surface can be constructed as an electrically conductive disk or platelet. In particularly preferred manner the light guide means are made from plastic or are constructed flexibly. This simplifies manufacture and permits universal use.

The light guide means can form an electrical contacting means on the sensor surface, for example, of the associated sensor surface control. This economizes on separate contacting means, such as for example, cables or the like. To this end the light guide means are constructed in electrically conductive manner, such as electrically conductive plastic.

The light guide means can have a reflecting surface. If this is provided on the surface facing the light source, efficiency can be increased. This is particularly advantageous with light guide means in channel form, an inner aluminizing or silvering of the channel increasing efficiency.

In the case of the above-described sensor element, the light source can be variable as a function of the switching state of the touch switch. For example, it can be activated or deactivated in accordance with the touch switch and therefore optically indicate the switching state thereof.

So that the arrangement can be made as simple as possible, a light source can be arranged essentially below the sensor surface and can be coupled to the latter as the light guide means by means of a channel or the like. For example, the light source and light guide means can be placed on a plate below the control surface.

For displaying symbols or the like in the illuminated state, the sensor surface can be at least partly light-transmitting or transparent or translucent. According to one possibility it contains corresponding light-transmitting recesses in the form of symbols, which are to be displayed. The latter are transilluminated by the light and are displayed through the control surface.

It is also possible for the light guide means to guide or conduct light from the light source in the form of a symbol to be displayed onto the sensor surface. For this purpose a corresponding pattern or the like can be present in the light guide means. The relayed light is projected onto the sensor surface and brings about the display of the symbol and for this purpose the sensor surface is made light-transmitting.

Alternatively to simply constructed light guide means in a very short channel form, they can be constructed as plastic light guides. For this purpose a central arrangement of several light sources for different sensor surfaces is possible. The light can be guided to the corresponding sensor surface by means of the light guide means from said light sources. Such a central or concentrated arrangement of light sources can offer many advantages, including with regards to the simpler construction of the printed circuit boards.

These and further features can be gathered from the claims, description and drawings and the individual features, both singly or in the form of subcombinations, can be implemented in an embodiment of the invention and in other fields and can represent advantageous, independently protectable constructions for which protection is hereby claimed. The subdivision of the application into individual sections and the subheadings in no way restrict the general validity of the statements made thereunder.

DESCRIPTION OF THE DRAWINGS

Embodiments of the invention are explained in greater detail hereinafter relative to the attached drawings which show.

DETAILED DESCRIPTION OF EMBODIMENTS

Figure 1:
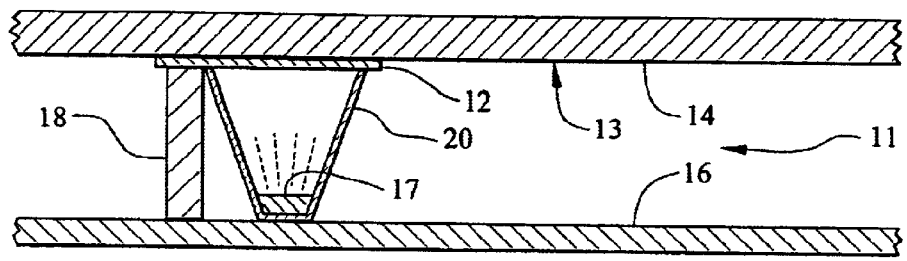
FIG. 1 A section through a touch switch arrangement with a sensor surface, a light source and a tunnel-shaped light guide means.

The touch switch arrangement 11 of FIG. 1 comprises a sensor surface 12 applied to the underside 13 of a glass ceramic plate 14 as the control surface. Parallel and spaced with respect to the glass ceramic plate 14 is provided a printed circuit board 16 which, in addition to other electrical means, carries a LED 17 as the light source and which is controllable. There is also a contacting means 18 in the form of an elongated elastic pin, which extends from the circuit board 16 to the sensor surface 12. Said contacting means links the sensor surface 12 electrically to the circuit board 16 or to the touch switch control circuit located thereon or connected thereto. Simultaneously the pin-like contacting means 18 can be used for keeping the sensor surface pressed against the underside 13 of the glass ceramic plate 14, provided that it is not fastened permanently in some other way. Advantageously for this purpose the contacting pin 18 is elastic, making it possible to compensate mechanical loads, which bring about a change to the spacing between the glass ceramic plate and the printed circuit board 16. The contacting means 18 is advantageously conductively fixed such as soldered or bonded to the circuit board 16. A contacting means can also be provided in the form of a cable or the like.

A light guide means in the form of a funnel 20 is inverted over the LED 17, which can be constructed in a surface-mounted manner. In this way it is possible to simultaneously bring about a fixing of the funnel by means of the LED. The funnel 20 is advantageously made from a flexible plastic and is opaque or light-proof and the plastic can be very thin. As can be seen in FIG. 1, the funnel 20 extends from the LED 17 to the sensor surface 12, so that no light is emitted to the environment, It is also very advantageous in this connection if the funnel material is elastic or flexible. As can also be seen in FIG. 1, this type of fixing is adequate for the funnel 20. It is vertically secured in position by clamping between sensor surface 12 and circuit board 16. It is horizontally secured in position by inverting over the LED 17.

Figure 2:
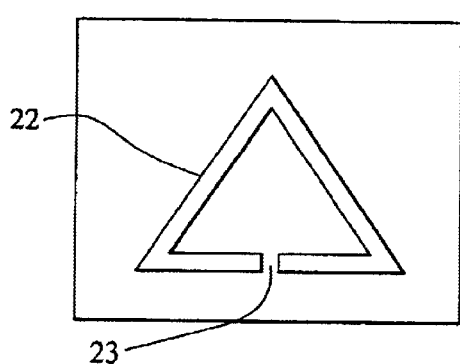
FIG. 2 A view from above of the sensor surface.

FIG. 2 is a plan view of the sensor surface 12, which has a substantially triangular, slot-like recess 22, which is closed with the exception of a narrow connecting web 23. By means of said connecting web 23, the interior of the recess 22 is conductively connected to the remaining sensor surface 12. In this way the recess 12 does not or only insignificantly impairs the function of the sensor surface for a capacitive touch switch.

Figure 3:
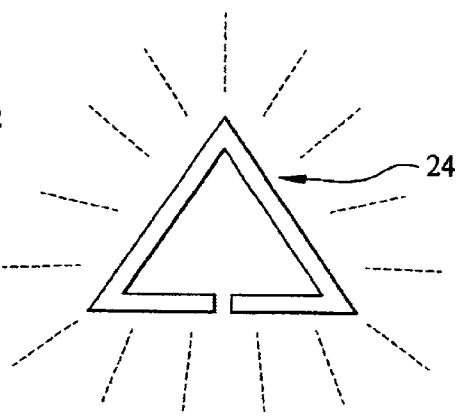
FIG. 3 A representation of the illuminated symbol of the sensor surface.

The light from the LED 17 can pass through the recess 22, so that according to FIG. 3 a luminous triangle or triangular frame Is produced as the symbol 24. Thus, the illuminated sensor surface 12 is displayed to a user through a light-transmitting glass ceramic plate. It would also be possible to make the connecting web 23 so thin that it could no longer be optically seen. There can also be several connecting webs. It is also possible by means of a transparent, but still electrically conductive coating with a corresponding opaque mask to produce a sensor surface not requiring a connecting web or the like.

Figure 4:
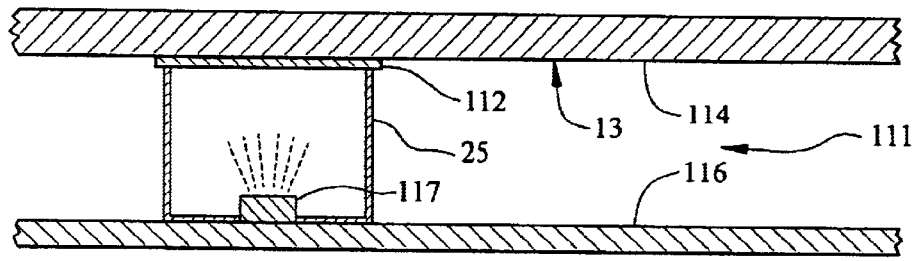
FIG. 4 A section through a touch switch arrangement similar to FIG. 1 with alternative light guide means.

The further embodiment of FIG. 4 shows a touch switch arrangement 111 with a glass ceramic plate 114, a printed circuit board 116 a LED 117 and a sensor surface 112. Here the light guide means 25 are provided both for light guidance or conduction and for pressing the sensor surface 112 onto the glass ceramic plate 114. In addition, they are responsible for electrical contacting on the sensor surface 112, which is performed by the pin-like contacting means 18 with the arrangement according to FIG. 1. Thus, in FIG. 4 the light guide means 25 must be made electrically conductive. It also has to be electrically connected to the printed circuit board 116, which may be by conductive adhesives, soldering or contact fields. The electrical contacting tot he sensor surface 112 can take place In a similar way. This is independent of whether the light guide means 25 are also used for the mechanical fixing of the sensor surface 112 or whether the same is already connected to the glass ceramic plate 114. Such a connection could as an example, be a sensor surface in the form of a conductive adhesive film. Another possibility is a vapour-deposited or otherwise permanently applied, conductive coating.

Although FIG. 4 shows that the light guide means 25 is inverted over the LED 117 in accordance with FIG. 1, this is unnecessary, because there is already a fixing to the printed circuit board 116 for electrical contacting to the sensor surface 112, for example when using conductive adhesives.

Thus, the invention provides the possibility in the case of random sensor surface types, particularly with sensor surfaces to be separately pressed onto a control surface, to shield LEDs serving for illumination purposes against the environment. The light guide means can also fulfill further functions, which can include the mechanical securing in position of the sensor surface and/or the electrical contacting thereof. Although the drawings can only show light guide means in a substantially shielding form, they can also be provided with light guidance functions acting over larger distances and possibly angles or bends. This is necessary when the distance between the light source an the sensor surface is increased.

Thus, the invention makes it possible to create a touch switch arrangement with a sensor surface, which engages on the underside of a control surface. It is at least partly light-transmitting or transparent and is illuminated from below by a LED as the light source. In one embodiment of the invention funnel-shaped, closed light guide means are provided, which conduct the light from the LED to the sensor surface or shield the same against the environment. The light guide means can also have further functions, such as securing in position or electrical contacting of the sensor surface.

According to an advantageous embodiment of the invention, a sensor element and a touch switch arrangement 11 have a sensor surface 12, which engages on the underside 13 of a control surface 114. It is at least partly light-transmitting and is illuminated from below by a LED 17 as the light source. Funnel-shaped, closed light guide means 20 are provided, which guide or conduct the light from the LED 17 to the sensor surface 12 or shield against the environment. The light guide means can additionally have further function such as securing in position or electrical contacting of the sensor surface 12.

What is claimed is:

1. A sensor element with a sensor surface said, sensor surface being a part of a capacitive touch switch, said sensor surface being fitted to the underside of a control surface of said capacitive touch switch, wherein said sensor surface is at least partly light-transmitting and is illuminated from below by a light source, wherein light guide means are provided for flux of light from said light source to said sensor surface, and wherein said light guide means shield said light source of a touch switch from the environment and from a remaining underside of said control surface.

2. Sensor element according to claim 1, wherein there is one light source per sensor element.

3. Sensor element according to claim 1, wherein there is one light guide means per sensor element.

4. Sensor element according to claim 1, wherein said light guide means have a wall, which surrounds said at least one light source and forms a channel to said sensor surface.

5. Sensor element according to claim 4, wherein said channel is closed in a substantially light-proof manner.

6. Sensor element according to claim 1, wherein said light guide means are at least partly constructed as a channel wall for pressing said sensor surface against said underside of said control surface.

7. Sensor element according to claim 6, wherein said light guide means are constructed for elastically pressing said sensor surface against said underside of said control surface.

8. Sensor element according to claim 1, wherein said light guide means form an electrical contacting means on said sensor surface.

9. Sensor element according to claim 1, wherein said light guide means have a reflecting surface.

10. Sensor element according to claim 9, wherein said light guide means have said reflecting surface on the surface facing said light source.

11. Sensor element according to claim 1, wherein said light guide means are made from plastic.

12. Sensor element according to claim 1, wherein said light guide means are flexible.

13. Sensor element according to claim 1, wherein said light source is variable as a function of the switching state of said touch switch.

14. Sensor element according to claim 1, wherein said sensor surface is constructed at least partly in light-transmitting manner for displaying symbols in the illuminated state.

15. Sensor element according to claim 14, wherein said sensor surface has light-transmitting recesses in the form of said symbols to be displayed.

16. Sensor element according to claim 14, wherein said sensor surface has light-transmitting recesses in the form of symbols to be displayed.

17. Sensor element according to claim 1, wherein said light guide means guide light from the light source to said sensor surface in the form of a symbol to be displayed.

18. A sensor element with a sensor surface, said sensor surface being a part of a capacitive touch switch, said sensor surface being fitted to the underside of a control surface of said capacitive touch switch.

wherein said sensor surface is at least partly light-transmitting and is illuminated from below by a light source, wherein light guide means are provided for a flux of light from said light source to said sensor surface, and wherein said light guide means have a wall, said wall surrounds said at least one light source and forms a channel to said sensor surface, and wherein said channel is closed in a substantially light-proof manner.

19. Sensor element according to claim 18, wherein said light guide means are at least partly constructed as a channel wall for pressing said sensor surface against said underside of said control surface.

20. Sensor element according to claim 17, wherein said light guide means are constructed for elastically pressing said sensor surface against said underside of said control surface.

21. Sensor element according to claim 18, wherein said light guide means form an electrical contacting means to said sensor surface.

22. Sensor element according to claim 18, wherein said light guide means have a reflecting surface on the surface facing said light source.

23. Sensor element according to claim 18, wherein said light guide means are flexible.

24. A sensor element with a sensor surface, said sensor surface being a part of a capacitive touch switch, said sensor surface being fitted to the underside of a control surface of said capacitive touch switch, wherein said sensor surface is at least partly light-transmitting and is illuminated from below by a light source, wherein light guide means are provided for a flux of light from said light source to said sensor surface, and wherein said light guide means form an electrical contacting means to said sensor surface.

25. Sensor element according to claim 24, wherein said light guide means are at least partly constructed as a channel wall for pressing said sensor surface against said underside of said control surface.

26. Sensor element according to claim 25, wherein said light guide means are constructed for elastically pressing said sensor surface against said underside of said control surface.

27. Sensor element according to claim 24, wherein said light guide means are made from plastic.

28. Sensor element according to claim 24, wherein said light guide means are flexible.

29. Sensor element according to claim 24, wherein said light source is variable as a function of the switching state of said touch switch.

30. Sensor element according to claim 24, wherein said sensor surface is constructed at least partly in light-transmitting manner for displaying symbols in the illuminated state.

31. Sensor element according to claim 30, wherein said sensor surface has light-transmitting recesses in the form of said symbols to be displayed.

32. Sensor element according to claim 30, wherein said sensor surface has light-transmitting recesses in the form of symbols to be displayed.

33. Sensor element according to claim 24, wherein said light guide means guide light from the light source to said sensor surface in the form of a symbol to be displayed.

* * * * *